United States Patent
Lin et al.

(10) Patent No.: US 7,598,169 B2
(45) Date of Patent: Oct. 6, 2009

(54) METHOD TO REMOVE BEOL SACRIFICIAL MATERIALS AND CHEMICAL RESIDUES BY IRRADIATION

(75) Inventors: Qinghuang Lin, Yorktown Heights, NY (US); Elbert E. Huang, Tarrytown, NY (US); Christy S. Tyberg, Mahopac, NY (US); Ronald A. DellaGuardia, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/677,100

(22) Filed: Feb. 21, 2007

(65) Prior Publication Data

US 2008/0200034 A1    Aug. 21, 2008

(51) Int. Cl.
*H01L 21/4763* (2006.01)

(52) U.S. Cl. ............... 438/640; 438/618; 438/637; 438/701; 257/E21.577; 257/E21.578

(58) Field of Classification Search ............. 438/618, 438/620, 641, 673, 708
See application file for complete search history.

(56) References Cited

U.S. PATENT DOCUMENTS

2006/0121721 A1* 6/2006 Lee et al. ............... 438/618
2006/0183314 A1* 8/2006 Dellaguardia et al. ....... 438/618

* cited by examiner

*Primary Examiner*—Savitri Mulpuri
*Assistant Examiner*—Cheung Lee
(74) *Attorney, Agent, or Firm*—Daniel P. Morris; Anne Vachon Dougherty (57) ABSTRACT

A method to fabricate interconnect structures that are part of integrated circuits and microelectronic devices by utilization of an irradiation to remove and clean a sacrificial material used therein is described. The advantages of utilizing the irradiation to remove the sacrificial material include reduced damage to interlayer dielectric layers that result in enhanced device performance and/or increased reliability.

32 Claims, 7 Drawing Sheets

METHOD TO REMOVE BEOL SACRIFICIAL MATERIALS AND CHEMICAL RESIDUES BY IRRADIATION

BACKGROUND OF THE INVENTION

1. Field of the Invention

The present invention relates to a method to fabricate interconnect structures that are part of integrated circuits and microelectronic devices by utilization of irradiation to remove and clean a sacrificial material used therein. The primary advantages of this method are reduced damage to interlayer dielectric layers that result in higher reliability and improved performance through reductions in moisture uptake and resistance-capacitance delays, respectively.

2. Background Art

It is widely known that the speed of propagation of interconnect signals is one of the most important factors controlling overall circuit speed as feature sizes are reduced and the number of devices per unit area is increased. Throughout the semiconductor industry, there has been a strong drive to reduce the dielectric constant, k, of the interlayer dielectric materials existing between metal lines. As a result, interconnect signals travel faster through conductors due to a reduction in resistance-capacitance (RC) delays. Unfortunately, these strategies are difficult to implement due to numerous issues associated with processing and integrating low dielectric constant materials as these materials can be especially prone to damage by various processes employed in the generation of interconnect structures. The damage observed in the dielectric materials is manifested by an increase in the dielectric constant and increased moisture uptake which may result in reduced performance and device reliability.

To reduce the dielectric constant of interlayer dielectric materials, a common approach is to introduce porosity into the material. This approach effectively supplants a portion of the dielectric material with air which has a dielectric constant of unity. Unfortunately, the introduction of porosity results in materials that are substantially more prone to modification by various processes commonly employed in the fabrication of interconnect structures as the porosity in these materials can often provide a pathway by which various chemical components can easily access the bulk of the low-k material. Thus, unlike dense dielectric systems, whereby modification may be localized to the surface of the dielectric and consequently may result in only minor effects, the extent of modification for a porous material can be dramatic as these changes can be realized through the entire dielectric material.

One particular processing step that is known to damage porous interlayer dielectric materials, including dielectric materials comprised of Si, C, O, and H, are plasma strip processes (i.e., dry strip) that are often used to remove sacrificial materials that are required in the integration process. These processes can result in removal of carbon in the interlayer dielectric film and may occur by a mechanism which involves de-methylation and often results in increase dielectric constants and hydrophilicity of the materials. To minimize the damage associated with such processes, efforts have been placed in developing improved processes that result in less damage to the interlayer dielectrics or developing new materials that are less prone to damage. Although some progress has been made, the damage associated with plasma strip and related processes remain as a key issue in the integration/implementation of low-k dielectric materials for advanced interconnect structures.

Alternatively, wet strip processes are also being explored to supplant damaging dry strip processes; however, these processes may also result in damage to the interlayer dielectric. Furthermore, these processes often cause logistic issue (such as switching from a dry etch tool to a wet tool) and result in the creation of waste products as the wet clean used for these processes cannot be used indefinitely.

Finally, there have been approaches to address the issue of damage by subsequent repair processes that utilize a chemical component that reacts with the modified low-k interlayer dielectric. These approaches may involve silylating agents that convert pendent silanol groups to a different functional group resulting in a recovery of the hydrophobicity (i.e., reduced moisture uptake) of the dielectric and reduction of the dielectric constant from its damaged state. Although, these approaches may be promising, the additional processing step required for damage recovery may result in additional processing costs, material wastes, and lower yields.

Thus, in order to achieve high performance microelectronic devices, it is necessary to reduce the dielectric constant of the interlayer dielectric materials to reduce resistance-capacitance (RC) delays. The use of low-k materials as interlayer dielectrics provides the reduction in capacitance between conducting metal features; however, these materials must be processed in a manner such that their attributes are not significantly degraded resulting in higher dielectric constants or moisture uptake which will invariably lead to reduced performance and/or reliability. Unfortunately, these low-k materials are prone to damage by various processes utilized in common integration schemes including dry strip processes. Consequently, alternative approaches to minimize or eliminate the processes that are sources for damage are important.

SUMMARY OF THE INVENTION

This invention relates to a method of fabrication of interconnect structures that can be employed in any microelectronic device including: high speed microprocessors, application specific integrated circuits (ASICs), and memory devices. The interconnect structures may be comprised of at least one conductive feature, formed on the substrate, with the substrate further comprising at least one insulating layer surrounding the conductive feature. The insulating layer may surround the at least one conductive feature at its bottom and lateral surfaces. The structure may further comprise at least one conductive barrier layer disposed at, at least one interface between the insulating layer and the at least one conductive feature. The combination of the at least one conductive feature and the insulating layers, may be repeated to form a multilevel interconnect stack. The interconnect structure may be one of a silicon wafer containing microelectronic devices, a ceramic chip carrier, an organic chip carrier, a glass substrate, a gallium arsenide, silicon carbide or other semiconductor wafer, a circuit board, or a plastic substrate.

In particular, the invention relates to a method where the utilization of sacrificial fill material that is removed primarily by irradiation. This allows the generation of interconnect structures comprised of low-k dielectrics in a reliable manner and leads to enhanced device performance by minimizing damage to layers that occur in typical back-end-of-the-line (BEOL) integration schemes. The sacrificial fill material may provide multiple purposes. First, it may serve as a planarizing layer in structures having topography in order to facilitate lithographic processing. Second, it may provide etch contrast during standard dry etch processes that are used to define the structure of the interconnect structure. Third, it is designed to be facilely removed by an irradiation process in order to minimize damage to the interconnect structure. The facile removal of the sacrificial fill material by irradiation provides an alternative approach to commonly used plasma strip processes (e.g., oxidizing or reducing plasmas) that are known to result in significant damage to low-k interlayer dielectrics. This damage leads to higher dielectric constants and increased moisture uptake which may result in reduced performance and degraded device reliability.

Another objective of the present invention is to provide a method that not only removes the sacrificial materials but also helps repair the damage incurred to the insulating low-k dielectric during processing.

Other and further objectives, advantages and features of the present invention will be understood by reference to the following specification in conjunction with the annexed drawings, wherein like parts have been given like numbers.

DESCRIPTION OF THE PREFERRED EMBODIMENTS

A detailed description of the methods involving sacrificial fill material is presented below. The sacrificial fill material can be utilized to enable the fabrication of interconnects that can be used in any microelectronic device.

Figure 1:
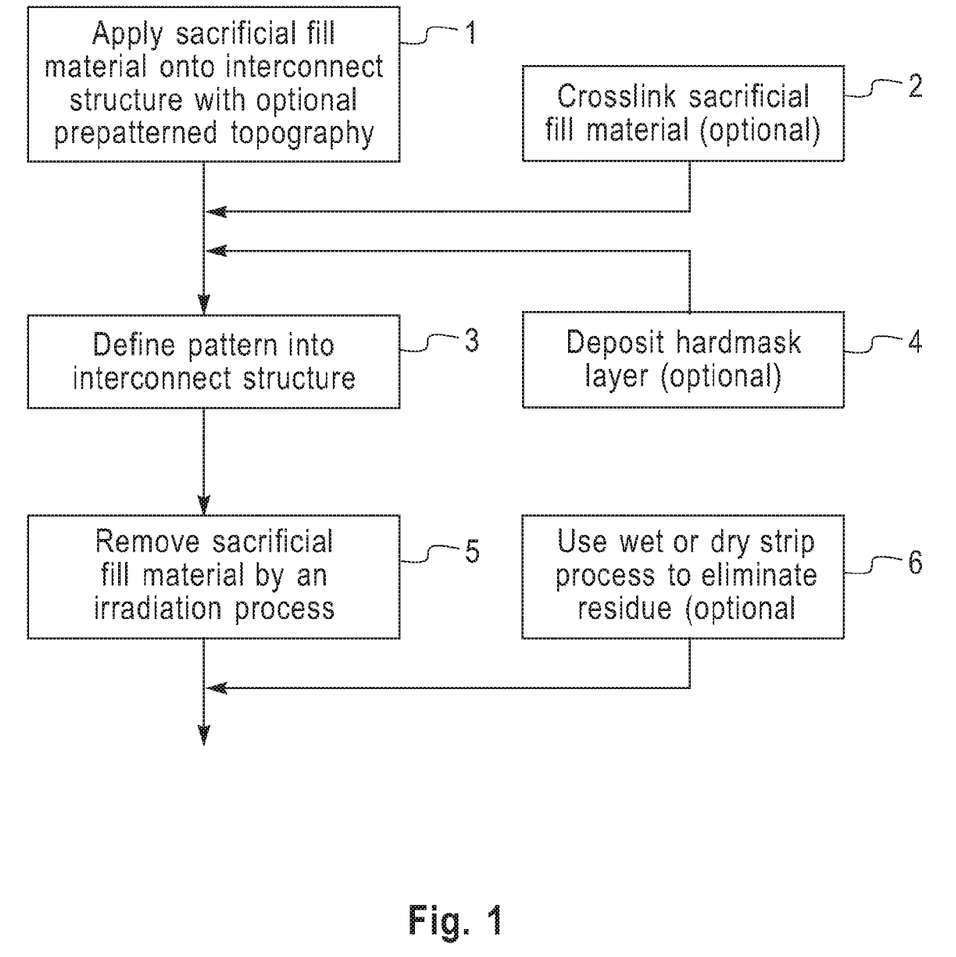
FIG. 1 is a schematic showing a generalized process flow for the use of a sacrificial fill material for the generation of an interconnect structure.

Referring to FIG. 1, a general process flow for the fabrication of interconnect structures is described. First, the sacrificial fill material is applied to an interconnect structure which may contain a prepatterned topography. Optionally, the sacrificial fill material can then be crosslinked. A hardmask material may also be optionally applied atop the sacrificial fill material. A pattern is then defined into the interconnect structure. Next the sacrificial fill material is removed by an irradiation process. Optionally, a wet or dry strip process can be employed to remove any residue remaining from the sacrificial fill material after irradiation.

The sacrificial fill material may be comprised of a polymeric system comprised of one or more components and may have any architecture including linear, branched, hyperbranched, star, etc. The sacrificial fill material may be a homopolymer, a copolymer, or a polymer mixture. This sacrificial material contains functional unit(s) that will undergo material decomposition (depolymerization) to form volatile species under an irradiation. Examples of materials that may be utilized as the sacrificial fill include but are not limited to: poly(styrenes), poly(esters), poly(acrylates), poly(methacrylates), and poly(ethers), poly(amides), Poly(imides), poly (norbornenes), poly(carbonates), poly(sulfone), poly(ethersulfone), poly(ethylenes), poly(propylenes), epoxy resins, poly(urethanes), poly(alkanes), poly(dienes) poly(vinyl alcohol), poly(vinyl ethers), poly(acrylic acid), and poly(ureas). Preferably, the sacrificial fill material is thermally stable to temperatures in excess of about 150° and may have a high glass transition temperature in excess of about 150°.

For single damascene integration, the interconnect structure will not contain the prepatterned topography and the uppermost layers should be planar. The pattern that is defined into this interconnect structure may correspond to either conducting metal vias, which form conductive pathways in a direction normal to the substrate, or lines, which form conductive pathways in a direction parallel to the substrate, whereby the metals are deposited by subsequent known processes.

Figure 2:
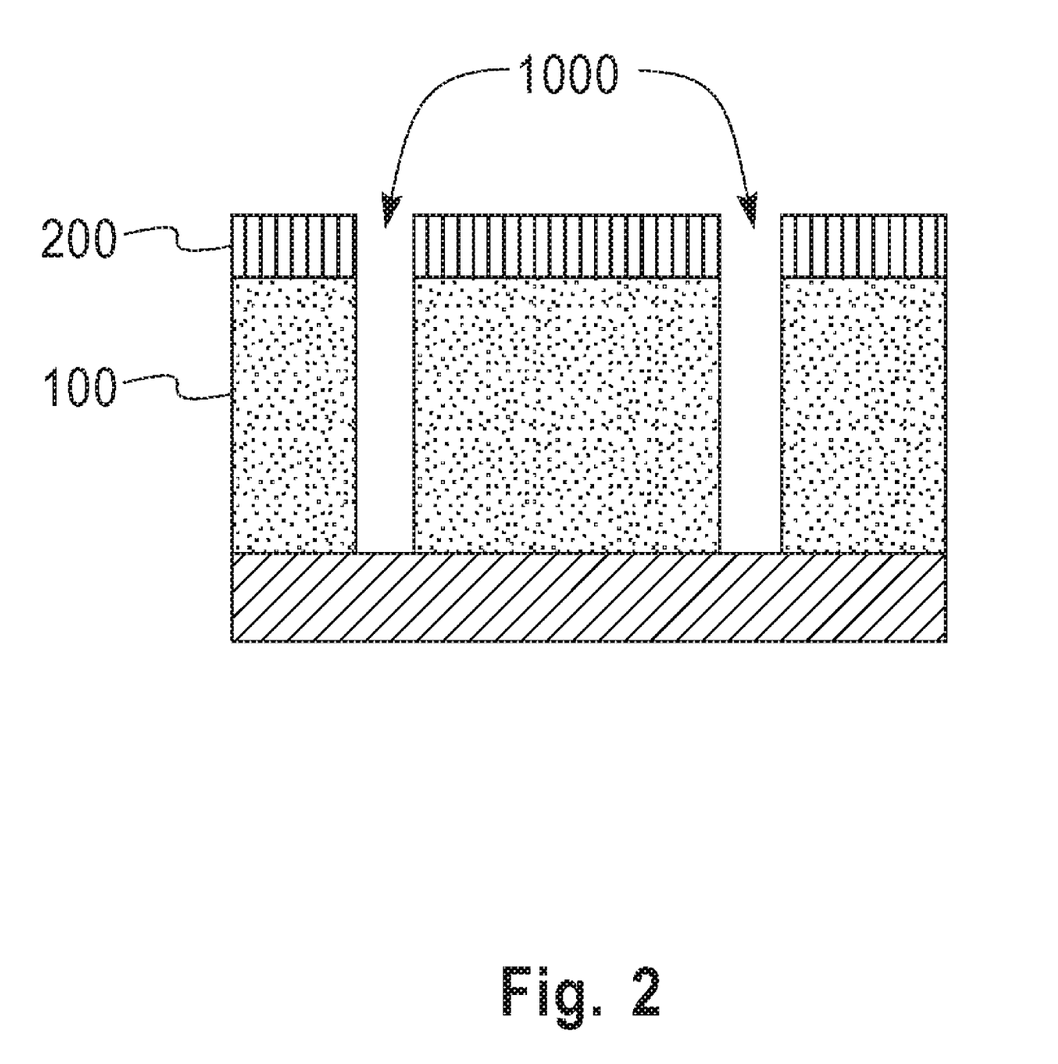
FIG. 2 is a cross-sectional view of a portion of the interconnect structure illustrated in accordance with an exemplary embodiment of the present invention.

For dual damascene integration the prepatterned topography may correspond to the vias and the pattern formed with the sacrificial fill material present may correspond to line patterning. Alternatively, the reverse may occur whereby the prepatterned topography may correspond to the lines and the pattern formed with the sacrificial fill material present may correspond to via patterning. Referring to FIG. 2, an interconnect structure comprised of an interlayer dielectric 100, chemical mechanical polish stop layer 200, is shown with the prepatterned topography 1000 having a via pattern is shown.

Figure 3:
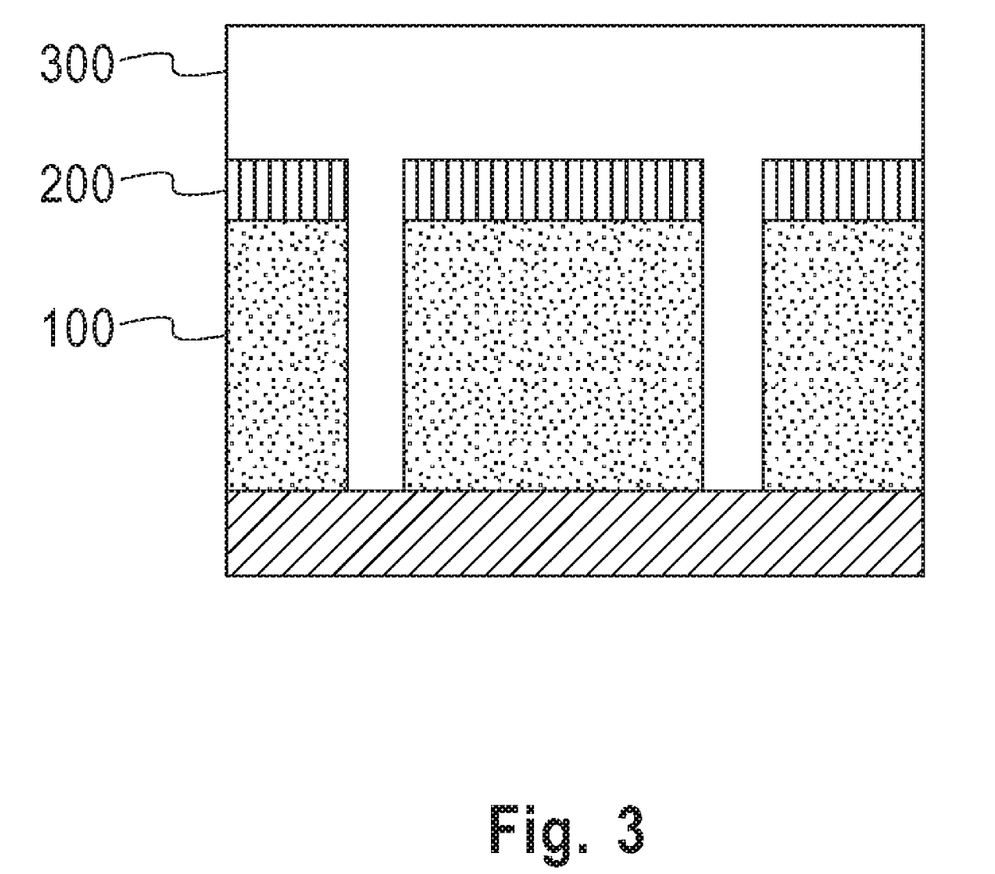
FIG. 3, is a cross-sectional view of a portion of the interconnect structure illustrated in FIG. 2, showing the deposition of the sacrificial fill material.

The sacrificial fill material is applied by any dry process including chemical vapor deposition (CVD), plasma enhanced chemical vapor deposition (PE CVD) process or any solvent based process including spin coating, spray coating, scan coating, and dip coating. Preferably, the sacrificial fill material is contained in a solution having an organic solvent which may be one or a combination of the following: propylene glycol methyl ether acetate (PGMEA), propylene glycol methyl ether (PGME), toluene, xylenes, anisole, mesitylene, butyrolactone, cyclohexanone, hexanones, ethyl lactate, and heptanones. Optionally, an antistriation agent may be codissolved in the solution containing the sacrificial fill material to produce films of high uniformity. Optionally, an via fill agent may be codissolved in the solution containing the sacrificial fill material to improve the filling of vias. In cases where a prepatterned topography exists, the sacrificial fill material preferably will planarize and gap fill the topographical features. The overburden thickness of the sacrificial fill material, which is the thickness of the sacrificial fill material atop the uppermost regions of the prepatterned topography, may be in the range of 1-1500 nm. Referring to FIG. 3, an interconnect structure with the sacrificial fill material 300 having a planar surface atop the interlayer dielectric 100 and chemical mechanical polish stop layer 200 while filling the prepatterned topography 1000 is shown.

After deposition, the sacrificial fill material that may be crosslinked by a thermal anneal or microwave, or a combination thereof, whereby, the crosslinking process involves curing temperatures in the range of about room temperature to 450° C. The crosslinking process can be performed in an inert atmosphere. The application of the crosslinking process may allow the deposition of additional layers atop the sacrificial fill material 300 without issues associated with: film integrity (e.g., film cracking or buckling), undesired interdiffusion between the sacrificial fill material and layers deposited atop the sacrificial film material, and dissolution of the sacrificial fill material for coatings of subsequent layers by solvent based processes.

Figure 4:
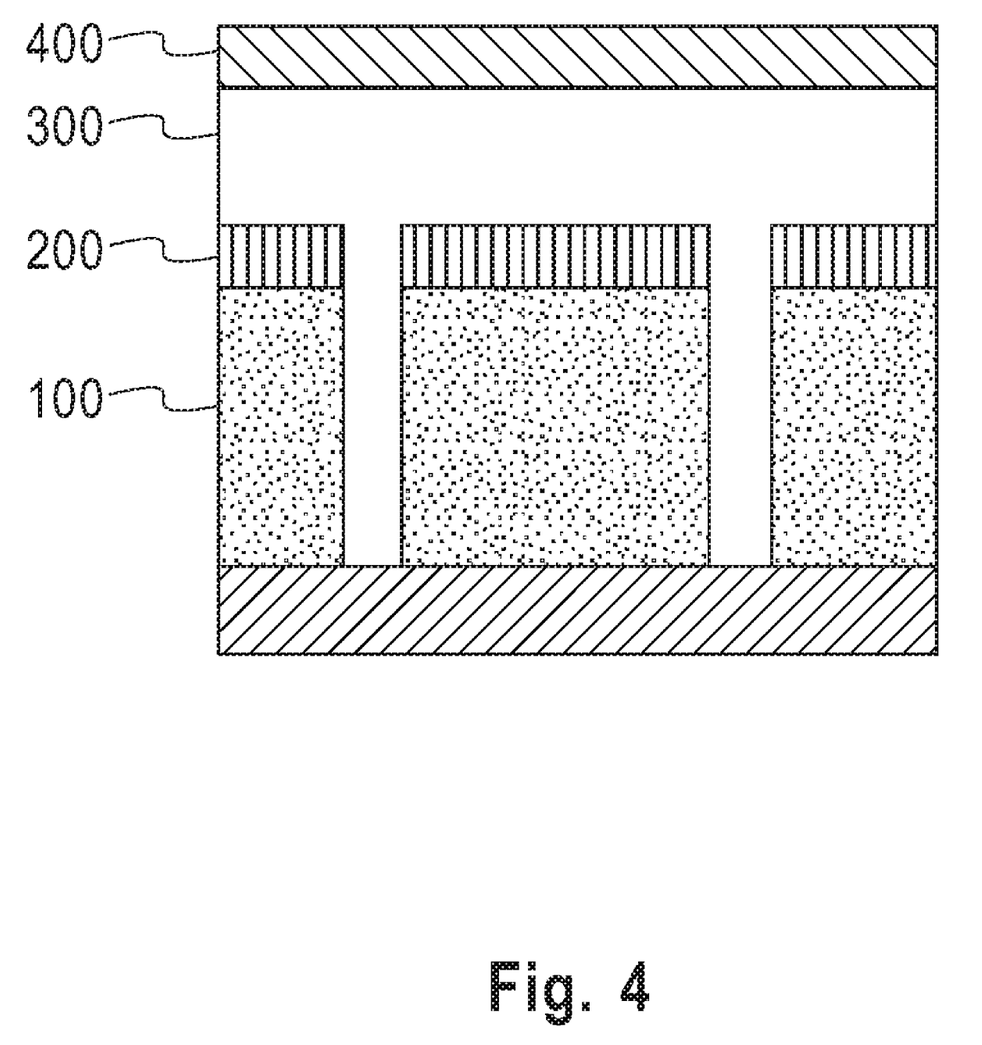
FIG. 4, is a cross-sectional view of a portion of the interconnect structure illustrated in FIG. 3, showing the deposition of the hardmask layer.

Referring to FIG. 4, a hardmask layer 400 that serves as an etch contrast layer may be deposited atop the sacrificial fill material 300 atop the interlayer dielectric 100 and chemical mechanical polish stop layer 200. The hardmask layer 400 may be deposited by any process including solution based processes including spin coating, spray coating, dip coating, and scan coating or by vapor deposition processes including chemical vapor deposition, physical deposition, sputtering, evaporation, and plasma enhanced chemical vapor deposition. The hardmask layer 400 may be comprised of elements of Si, C, O, N, H, to form silicon oxide, silicon carbide, or silicon nitride. The hardmask layer 400 may be comprised of one layer or multiple layers of materials.

Figure 5:
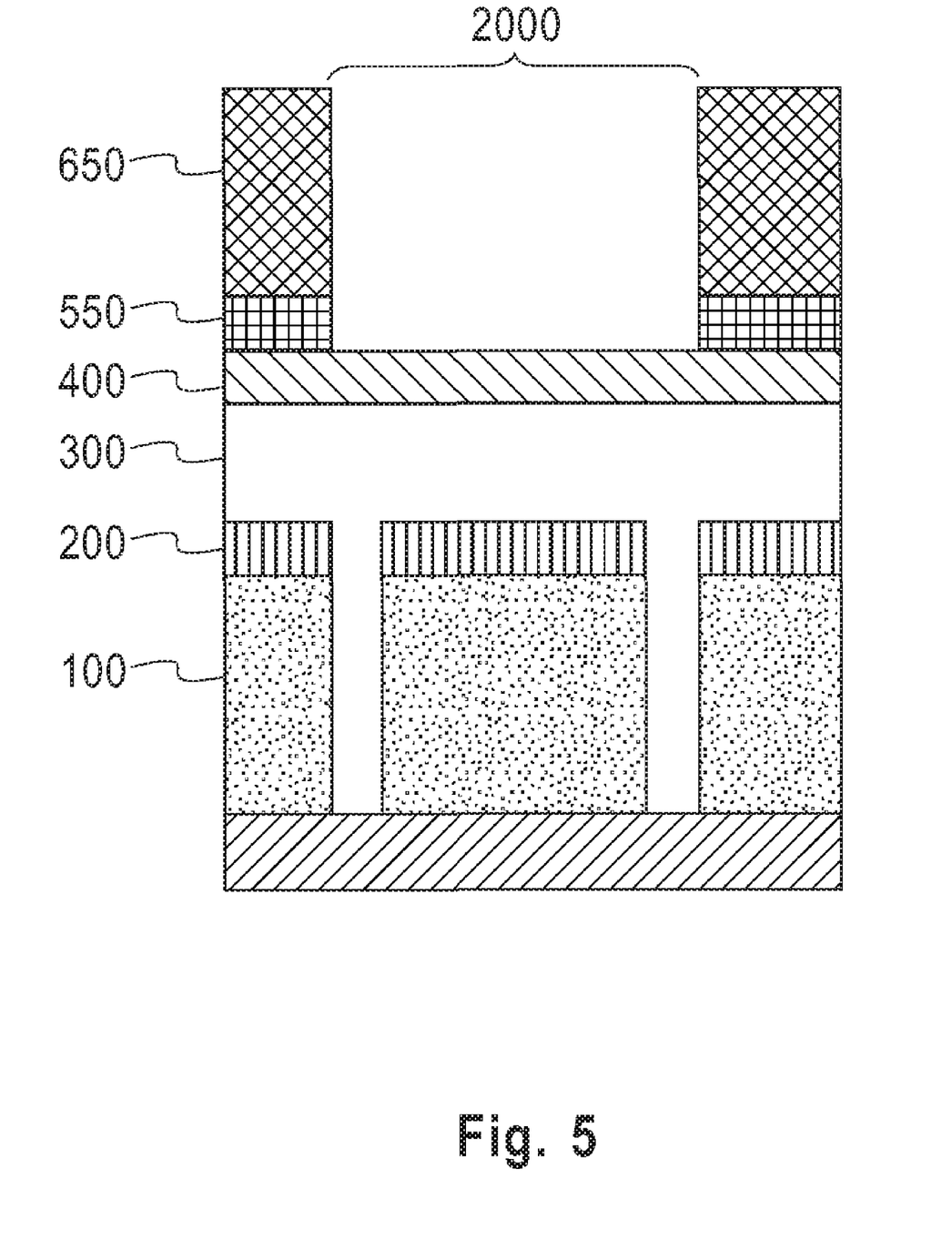
FIG. 5, is a cross-sectional view of a portion of the interconnect structure illustrated in FIG. 4, showing the deposition of antireflective and photoresist layer followed by patterning

Referring to FIG. 5, the definition of the pattern 2000 can then be defined using standard lithographic processes that may include an antireflective coating layer 550 and photoresist layer 650 that are deposited atop the interconnect structure. The sacrificial fill material 300 facilitates this lithography process by providing proper optical properties and a planar surface for the coating layer 550 and photoresist layer 650.

Figure 6:
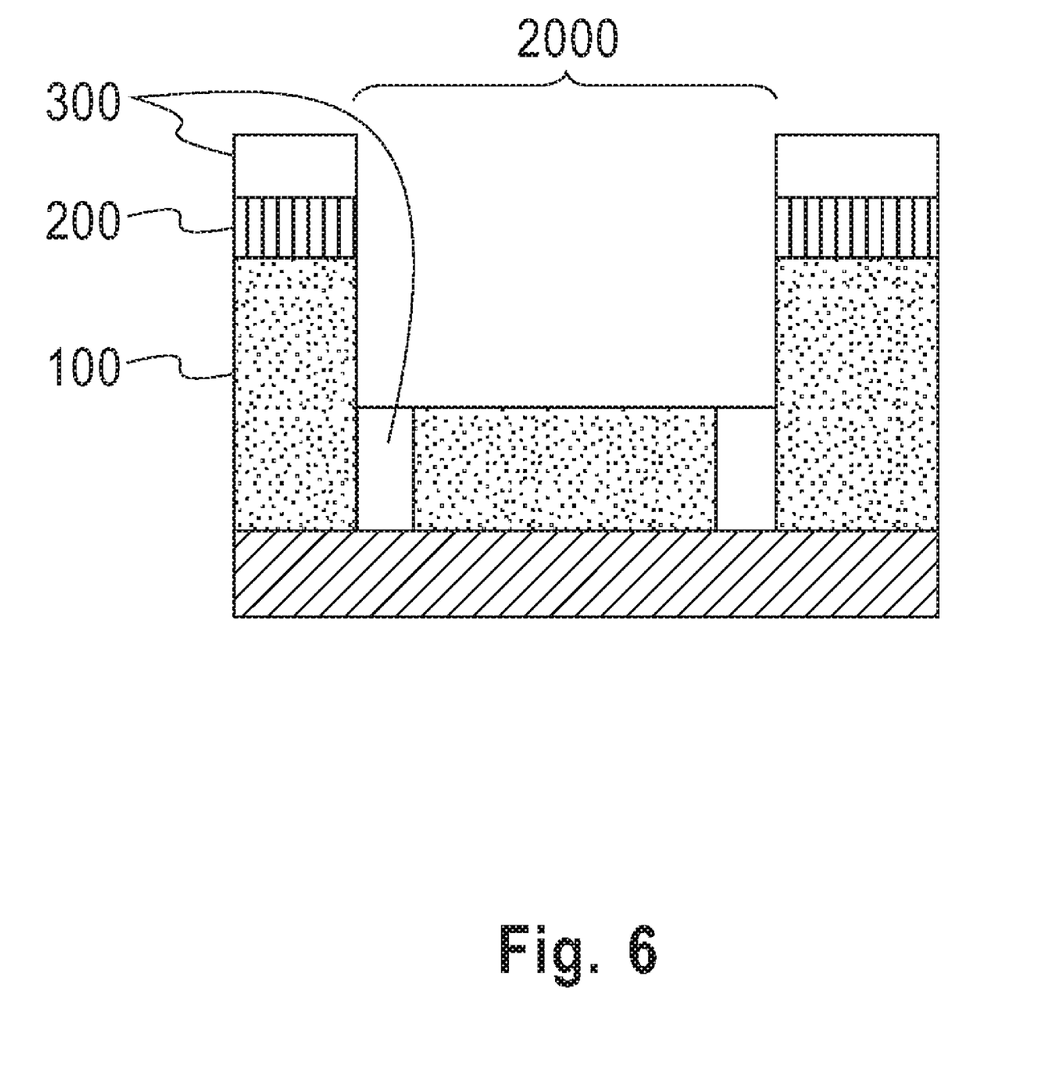
FIG. 6, is a cross-sectional view of a portion of the interconnect structure illustrated in FIG. 5, showing the transfer of the pattern defined by the photoresist layer into underlying layers in the interconnect structure.

The pattern 2000 can then be transferred into the interlayer dielectric 100 and chemical mechanical polish stop layer 200 of the interconnect structure by standard dry etch transfer processes as shown in FIG. 6. During this pattern transfer process, the hardmask layer 400 and a portion of the sacrificial fill material 300 may be removed. The sacrificial fill material 300 may facilitate the pattern transfer process by providing etch contrast during dry etch processes.

Figure 7:
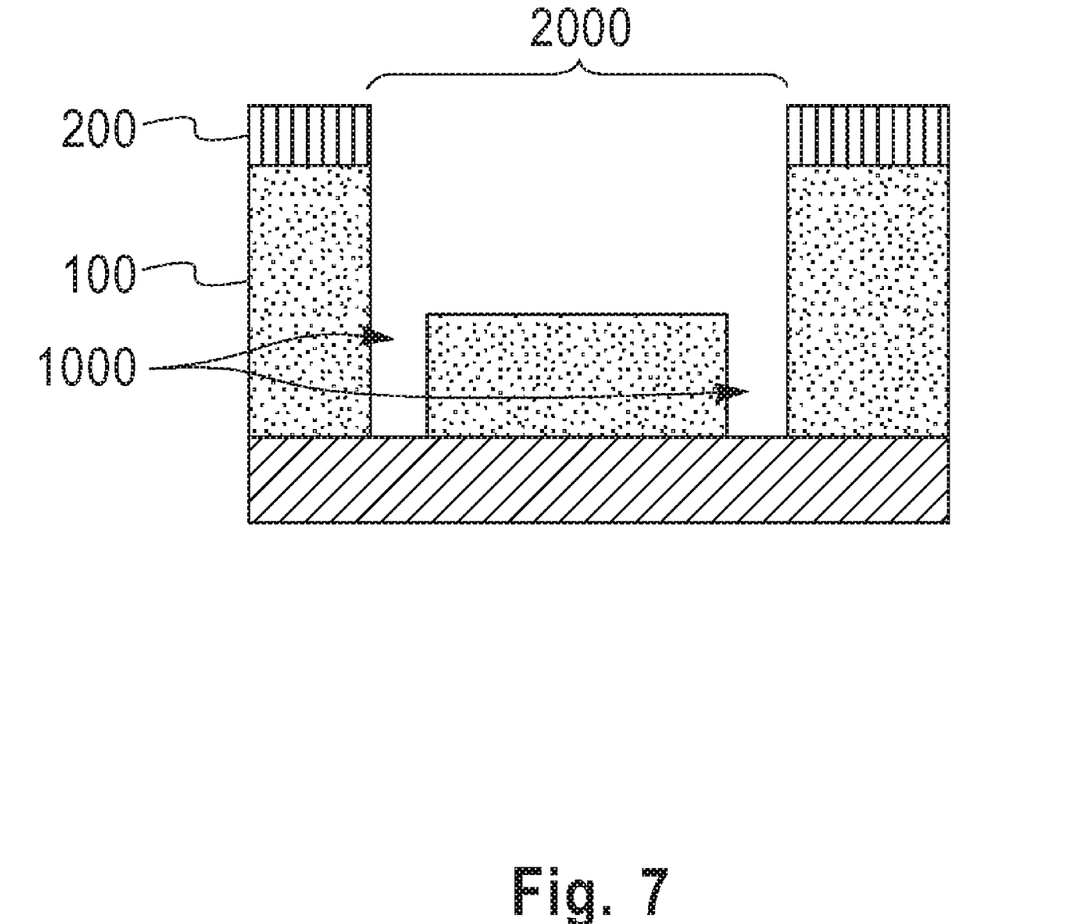
FIG. 7, is a cross-sectional view of a portion of the interconnect structure illustrated in FIG. 6, showing the interconnect structure after removing the sacrificial fill material by irradiation.

Referring to FIG. 7, the sacrificial fill material 300 is then removed by an irradiation process resulting in a interconnect structure having a prepatterned topography 1000 and pattern 2000. The source of the irradiation process may be an ultraviolet (UV) or a visible light, an electron beam, X-ray, high energy charged or neutral particles, or a combination thereof either simultaneously or in a series fashion. Preferably, the irradiation source is a UV light or an electron beam. Most preferably, the irradiation source is a UV light with a wavelength of 1-400 nm.

This UV light may be generated by one or more broadband UV lamps including high-power mercury UV lamps or an excimer laser. The excimer laser may be generated from excimers $Ar_2^*$ (126 nm), $Kr_2^*$ (146 nm), $F_2$ (157 nm), $Xe_2^*$ (172 & 175 nm), ArF (193 nm), KrF (248 nm), XeBr (282 nm), XeCl (308 nm), XeF (351 nm), $CaF_2$ (193 nm), KrCl (222 nm), $Cl_2$ (259 nm). This UV light may be further enhanced or diffused with lens systems or optical diffusing elements to focus the UV light on a specific location on a wafer or to improve the uniformity of the UV light. The UV light source with a higher output power is preferred.

The irradiation process may be carried out at temperature from room temperature to 600° C. whereby the sacrificial fill material is decomposed into low molecular weight byproducts that are expelled from the interconnect structure. Preferably, The irradiation process may be carried out at a temperature from 100° C. to 425° C. The irradiation process may be performed under inert or reducing atmospheres including but not limited to atmospheres comprising vacuum, nitrogen, argon, helium, ammonia, forming gas, hydrocarbon gases or vapors.

The irradiation process may be performed in an environment wherein the irradiation promotes further cure of low-k dielectric and/or repair of the damage incurred to the low-k dielectric during the interconnect fabrication process. This environment may comprise of gases or vapors including amine, silylamine, chlorosilylamine.

Furthermore, the irradiation process may result in further cure of the low-k interlayer dielectric 100 by removal of a sacrificial pore generator contained in the low-k interlayer dielectric.

If the irradiation process does not completely remove the sacrificial fill material 100, a reactive plasma strip or wet clean process may be employed to remove any remaining residue from said sacrificial fill material. The reactive plasma strip may be generated from one or a combination of the following $N_2$, $H_2$, $NH_3$, $O_2$, $CH_3F$, $C_2F_6$, He, Ar, and $CO_2$. In addition, a wet clean process may be employed to remove any remaining residue from sacrificial fill material and may include the use of: organic solvents, aqueous acids, and aqueous bases.

The interconnect structure may be comprised of a porous low-k dielectric between about 1.1 and 4.0 which may be a porous ultralow-k dielectric comprised of a silsesquioxane or siloxane system or a porous ultralow-k dielectric is a CVD deposited dielectric having the composition $Si_vN_wC_xO_yH_z$. where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$.

Other processes known in the art may be used to generate the interconnect structure following dual damascene integration. These include processes such as photolithography, contact printing including imprint lithography, deposition of patterning layers, metal-containing liner barrier deposition, metal plating, chemical mechanical polishing, and other common processes known in the art. These steps can be performed repetitively in order to generate a multilevel interconnect structure.

What is claimed is:

1. A method for fabricating an interconnect structure comprising a low-k interlayer dielectric by a damascene process comprising:
    applying a sacrificial fill material onto an interconnect structure that comprises a prepatterned topography;
    defining a pattern into the interconnect structure by lithographic and dry etch transfer processes;
    removing said sacrificial fill material by an irradiation process in an environment comprising of at least one gas or vapor selected from the group consisting of amine, silylamine and chlorosilylamine to remove the sacrificial fill material and promote repair of the low-k interlayer dielectric.

2. The method of claim 1, wherein said prepatterned topography corresponds to vias of an interconnect structure and said pattern corresponds to the lines of an interconnect structure.

3. The method of claim 1, wherein said prepatterned topography corresponds to the lines of an interconnect structure and said pattern corresponds to the vias of an interconnect structure.

4. The method of claim 1, wherein said sacrificial fill material is removed by an irradiation process using at least one of the irradiation sources selected from the group consisting of an ultraviolet (UV) or a visible light, an electron beam, X-ray, high energy charged or neutral particles, or a combination thereof either simultaneously and in a series fashion.

5. The method of claim 4, wherein said irradiation source a source selected from the group consisting of UV light and an electron beam.

6. The method of claim 4, wherein said irradiation source is UV light with a wavelength of about 1-400 nm generated by at least one source selected from the group consisting of a broadband UV lamp, an excimer laser and a combination thereof.

7. The method of claim 6, wherein said excimer laser is generated from at least one of the excimers selected form the group consisting of $Ar_2^*$ (126 nm), $Kr_2^*$ (146 nm), $F_2$ (157 nm), $Xe_2^*$ (172 & 175 nm), ArF (193 nm), KrF (248 nm), XeBr (282 nm), XeCl (308 nm), XeF (351 nm), $CaF_2$ (193 nm), KrCl (222 nm) and $Cl_2$ (259 nm).

8. The method of claim 4, where in said UV light is further enhanced or diffused with a lens systems or optical diffusing elements.

9. The method of claim 1, wherein said irradiation process is carried out at temperature from about room temperature to about 600° C. whereby said sacrificial fill material is decomposed into low molecular weight byproducts that are expelled from the interconnect structure.

10. The method of claim 1, wherein said sacrificial fill material contains at least one functional unit that will undergo material decomposition to form volatile species under said irradiation process.

11. The method of claim 1, wherein said sacrificial fill material is crosslinked by a process selected from the group consisting of thermal anneal or microwave, and combination thereof.

12. The method of claim 1, wherein said sacrificial fill material is deposited by a dry process selected from the group consisting of chemical vapor deposition, plasma enhanced chemical vapor deposition process and combinations thereof.

13. The method of claim 1, wherein said sacrificial fill material is deposited from a solution by a solvent based process selected from the group consisting of spin coating, spray coating, scan coating, and dip coating.

14. The method of claim 13, wherein said solvent based process comprises a solution having an organic solvent which is selected from a group consisting of propylene glycol methyl ether acetate (PGMEA), propylene glycol methyl ether (PGME), toluene, xylenes, anisole, mesitylene, butyrolactone, cyclohexanone, hexanones, ethyl lactate, and heptanones.

15. The method of claim 13, wherein an antistriation agent is codissolved in said solution containing said sacrificial fill material to produce films of high uniformity.

16. The method of claim 13, wherein a via fill agent is codissolved in said solution containing the sacrificial fill material to improve the filling performance of said sacrificial fill material.

17. The method of claim 1, wherein said sacrificial fill material fills the gaps and planarizes said interconnect structure having topographical features.

18. The method of claim 1, wherein said sacrificial fill material forms an overburden thickness of 1-1500 nm.

19. The method of claim 1, wherein said sacrificial fill material is partially removed by said defining of said pattern into the interconnect structure by lithographic and dry etch transfer processes.

20. The method of claim 1, wherein a reactive plasma strip is employed after said irradiation step to remove any remaining residue from said sacrificial fill material.

21. The method of claim 20, wherein said reactive plasma strip is generated from a species selected from the group consisting of $N_2$, $H_2$, $NH_3$, $O_2$, $CH_3F$, $C_2F_6$, He, Ar, and $CO_2$.

22. The method of claim 1, wherein a wet clean process is employed after said irradiation step to remove any remaining residue from said sacrificial fill material whereby the wet clean comprises a species selected from the group consisting of organic solvents, aqueous acids, and aqueous bases.

23. The method of claim 1, wherein a hardmask layer that serves as an etch contrast layer is deposited atop said sacrificial fill material and is consumed during said defining of said pattern into the interconnect structure by lithographic and dry etch transfer processes.

24. The method of claim 23, wherein said hardmask layer is deposited atop said sacrificial fill material by a solution based process selected from the group consisting of spin coating, spray coating, dip coating, and scan coating or by a vapor deposition process including chemical vapor deposition, physical deposition, evaporation, sputtering, and plasma enhanced chemical vapor deposition.

25. The method of claim 23, wherein said hardmask layer is comprised of elements of Si, C, O, N, H, to form a material selected from the group consisting of silicon oxide, silicon carbide, and silicon nitride.

26. The method of claim 1, wherein said low-k dielectric between about 1.1 and 4.0.

27. The method of claim 26, wherein said low-k interlayer dielectric, is porous, and is comprised of spin-on silsesquioxane or siloxane or a CVD deposited dielectric having the composition $SI_V N_W C_X O_Y H_Z$, where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$.

28. A method for fabricating an interconnect structure comprising a low-k interlayer dielectric by a damascene process comprising:

applying a sacrificial fill material onto an interconnect structure that comprises a prepatterned topography;

defining a pattern into the interconnect structure by lithographic and dry etch transfer processes;

removing said sacrificial fill material by an irradiation process, wherein said sacrificial fill materials is comprised of an organic system comprised of C, O, H and N, and is one or more components and has a structure selected from the group consisting of linear, branched, hyperbranched and star; is a homopolymer, a copolymer, or a polymer mixture and may be comprised of at least one of the constituents selected from the group consisting of poly(styrenes), poly(esters), poly(acrylates), poly(methacrylates), and poly(ethers), poly(amides), Poly(imides), poly(norbornenes), poly(carbonates), poly(sulfone), poly(ether-sulfone), poly(ethylenes), poly(propylenes), epoxy resins, poly(urethanes), poly(alkanes), poly(dienes) poly(vinyl alcohol), poly(vinyl ethers), poly(acrylic acid), and poly(ureas).

29. The method of claim 28, wherein said irradiation process is performed under conditions selected from the group consisting of vacuum, inert, and reducing atmospheres including at least one gas or vapor selected from the group consisting of nitrogen, argon, helium, ammonia, forming gas, hydrocarbon gases and vapors.

30. The method of claim 28, wherein said prepatterned topography corresponds to structures selected from the group consisting of (1) vias of an interconnect structure and said pattern corresponds to the lines of an interconnect structure and (2) to the lines of an interconnect structure and said pattern corresponds to the vias of an interconnect structure;

wherein said sacrificial fill material is removed by an irradiation process using at least one of the irradiation sources selected from the group consisting of an ultraviolet (UV) or a visible light, an electron beam, X-ray, high energy charged or neutral particles, or a combination thereof either simultaneously and in a series fashion;

wherein said irradiation process is performed by a process selected from the group consisting of (1) at temperature from about room temperature to about 600° C. whereby said sacrificial fill material is decomposed into low molecular weight byproducts that are expelled from the interconnect structure, (2) being in an environment selected from the group consisting of under vacuum, inert, and reducing atmospheres including at least one gas or vapor selected from the group consisting of nitrogen, argon, helium, ammonia, forming gas, hydrocarbon gases and vapors, and (3) being in an environment comprising of at least one gas or vapor selected from the group consisting of amine, silylamine and chlorosilylamine;

wherein said sacrificial fill materials is comprised of a crosslinking functional group either as a separate component or as a group bound to the polymer, and is crosslinked by a process selected from the group consisting of thermal anneal or microwave, and combination thereof, wherein said sacrificial fill material s deposited selected from the group consisting of (1) by a dry process selected from the group consisting of chemical vapor deposition , plasma enhanced chemical vapor deposition process and combinations thereof, and (2) from a solution by a solvent based process selected from the group consisting of spin coating, spray coating, scan coating, and dip coating;

wherein said sacrificial fill material fills the gaps and planarizes said interconnect structure having topographical features;

wherein said sacrificial fill material forms an overburden thickness of 1-1500 nm;

wherein said sacrificial fill material is partially removed by said defining of said pattern into the interconnect structure by lithographic and dry etch transfer processes;

wherein a reactive plasma strip is employed after said irradiation step to remove any remaining residue from said sacrificial fill material;

wherein a wet clean process is employed after said irradiation step to remove any remaining residue from said sacrificial fill material whereby the wet clean comprises a species selected from the group consisting of organic solvents, aqueous acids, and aqueous bases;

wherein a hardmask layer that serves as an etch contrast layer is deposited atop said sacrificial fill material and is consumed during said defining of said pattern into the interconnect structure by lithographic and dry etch transfer processes, and wherein said low-k dielectric between about 1.1 and 4.0.

31. A method for fabricating an interconnect structure comprising a low-k interlayer dielectric by a damascene process comprising:

applying a sacrificial fill material onto an interconnect structure that comprises a prepatterned topography, defining a pattern into the interconnect structure by lithographic and dry etch transfer processes;

removing said sacrificial fill material by an irradiation process, wherein said sacrificial fill material comprises a crosslinking functional group as one of a separate component and a group bound to the polymer.

32. The method of claim 31, wherein said crosslinking process involves curing temperatures in the range of about room temperature to about 450° C.

* * * * *